United States Patent
Pan et al.

(10) Patent No.: US 8,643,071 B2
(45) Date of Patent: Feb. 4, 2014

(54) INTEGRATED SNUBBER IN A SINGLE POLY MOSFET

(75) Inventors: Ji Pan, San Jose, CA (US); Daniel Ng, Campbell, CA (US); Anup Bhalla, Santa Clara, CA (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 0 days.

(21) Appl. No.: 13/517,770

(22) Filed: Jun. 14, 2012

(65) Prior Publication Data

US 2013/0334599 A1 Dec. 19, 2013

(51) Int. Cl.
*H01L 29/76* (2006.01)

(52) U.S. Cl.
USPC .... 257/288; 257/302; 257/337; 257/E27.016; 257/E21.616

(58) Field of Classification Search
USPC ................................................ 257/300–340
See application file for complete search history.

(56) References Cited

U.S. PATENT DOCUMENTS

| 7,605,427 | B2 | 10/2009 | Hirler |
| 2010/0163950 | A1* | 7/2010 | Gladish et al. ................ 257/302 |
| 2011/0042727 | A1 | 2/2011 | Pan et al. |

OTHER PUBLICATIONS

Application Note AN100-1 Alpha & Omega Semiconductor "Snubber Design for Noise Reduction in Switching Circuits" May 2007, Sanjay Havamur.

\* cited by examiner

*Primary Examiner* — Mamadou Diallo
(74) *Attorney, Agent, or Firm* — Joshua D. Isenberg; JDI Patent

(57) ABSTRACT

A MOSFET device includes one or more active device structures and one or more dummy structures formed from semiconductor drift region and body regions. The dummy structures are electrically connected in parallel to the active device structures. Each dummy structure includes an electrically insulated snubber electrode formed proximate the body region and the drift region, an insulator portion formed over the snubber electrode and a top surface of the body region, and one or more electrical connections between the snubber electrode and portions of the body region and a source electrode. It is emphasized that this abstract is provided to comply with rules requiring an abstract that will allow a searcher or other reader to quickly ascertain the subject matter of the technical disclosure. It is submitted with the understanding that it will not be used to interpret or limit the scope or meaning of the claims.

21 Claims, 5 Drawing Sheets

FIG. 3A
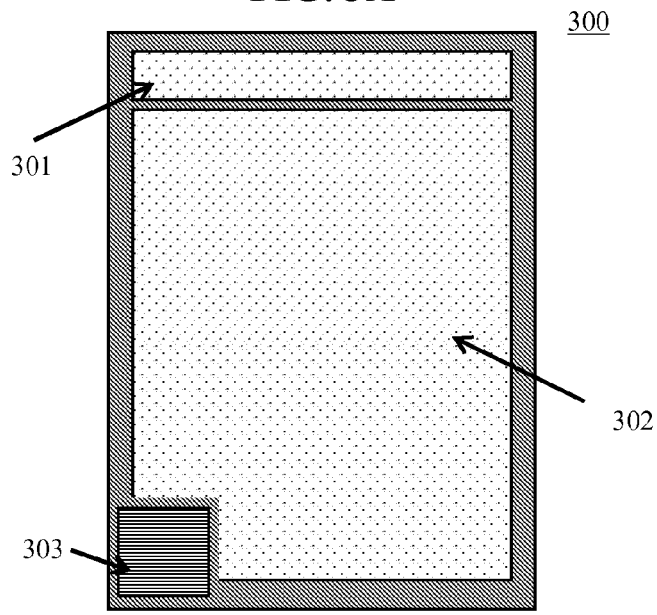
FIG. 3B
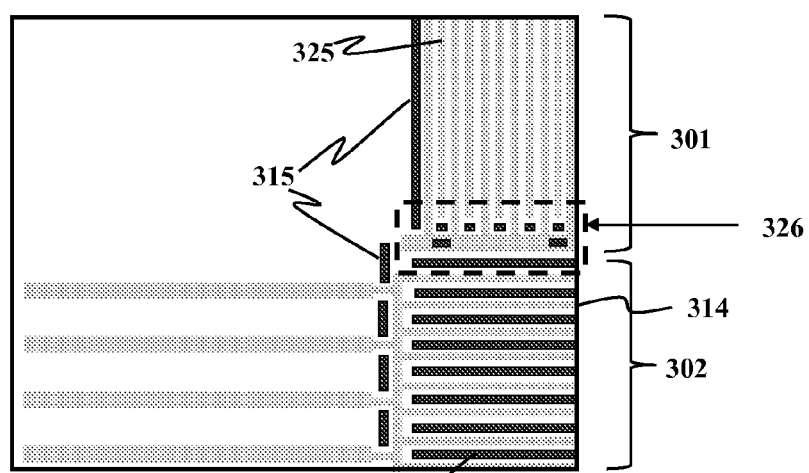
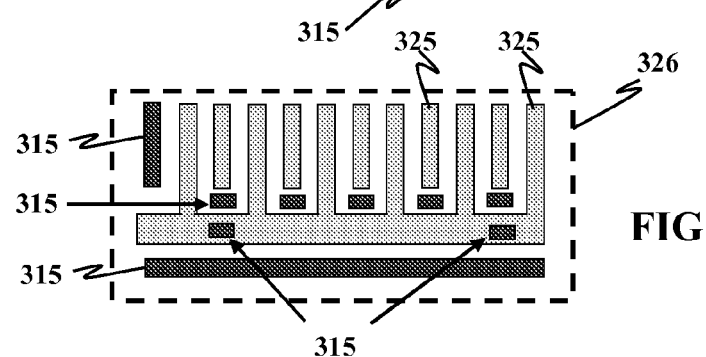
FIG. 3C

INTEGRATED SNUBBER IN A SINGLE POLY MOSFET

FIELD OF THE INVENTION

This invention generally relates to metal oxide silicon field effect transistors (MOSFETs) and more particularly to non-shielded gate trench MOSFETs (non-SGT MOSFETs).

BACKGROUND OF THE INVENTION

One of the benefits of a using a MOSFET device is the high rate at which the device can be switched "on" and "off." Faster switching allows for a more efficient device, but it also creates a higher voltage peak of the phase node when the device is switched into the "on" position. This voltage peak is also known as ringing. When used in a DC-DC application, the voltage peak of a phase node needs to be lower than 80% (or even much lower) of the device $V_{DS}$ rating in order for the device to maintain a high enough efficiency and avoid EMI issues. However, there is a trade-off between efficiency and ringing. Accordingly, gains in efficiency are made at the cost of an increase in the ringing.

The MOSFET's switching behavior is affected by the parasitic capacitances between the device's three terminals, that is, gate-to-source ($C_{GS}$), gate-to-drain ($C_{GD}$) and drain-to-source ($C_{DS}$) capacitances. The MOSFET parasitic capacitances are commonly provided in the data sheet parameters as $C_{iss}$ ($C_{iss}=C_{GS}+C_{rss}$), $C_{oss}$ ($C_{oss}=C_{DS}+C_{rss}$), and $C_{rss}$ ($C_{rss}=C_{GD}$). Increases in $C_{oss}$ result in a reduction in the efficiency.

High values of $C_{oss}$ is always achieved through the use of SGT MOSFET devices. These devices typically have a $C_{oss}$ of around 250-350 pF per mm². If an even higher $C_{oss}$ is desired, the designer can incorporate additional snubbers either within the device die or externally to reduce ringing. However, reductions in $C_{oss}$ to capacitances below 250 pF per mm² for high efficiency are difficult to achieve due to the intrinsic snubber created by the shielded gate trench portion of the SGT MOSFET, which have an adjustable snubber resistor but a fixed $C_{oss}$. Therefore, the optimum balance between efficiency and ringing is not always possible when using SGT MOSFETs due to high $C_{oss}$.

In order to allow for more flexibility in device design, it would be preferable to start with a device that has a lower $C_{oss}$. This would provide the designer a way to optimize the balance between the $C_{oss}$ and efficiency that will minimize ringing while still allowing for the efficiency required for a given set of design parameters. The use of a non-SGT MOSFET allows for this design option. A typical non-SGT MOSFET device has a $C_{oss}$ of about 100 pF per mm². From this lower level of capacitance, there is a range of approximately 150 pF per mm² in which the designer is able to alter the device $C_{oss}$ and snubber reisistor such that the voltage peak of a phase node does not exceed the maximum operating conditions for the device while still being able to maximize the efficiency of the device.

In a non-SGT MOSFET device the value of $C_{oss}$ can be increased by integrating a snubber circuit into the design. Snubber circuits are well known in the art and have been used to reduce ringing in MOSEFT devices. The snubber circuit is typically attached in parallel between the source and drain as an external component. Therefore, a snubber capacitor supplements the value of $C_{DS}$ of the MOSFET. Since $C_{DS}$ is a component of $C_{oss}$, an increase in $C_{DS}$ will increase the value of $C_{oss}$. However, snubbers have not previously been integrated into the die containing the MOSFET. Currently, snubber circuits are only partly integrated into MOSFET devices using the intrinsic source poly in the SGT device to provide an adjustable resistor but $C_{oss}$ is fixed. The ability to integrate the snubber circuit into the MOSFET would create advantages in the final product by allowing for more flexibility to increase or decrease the value of $C_{oss}$ and reduce the printed circuit board (PCB) area in the application circuit since there is no external snubber needed. Additionally, the integration of the dummy devices should preferably be accomplished without the use of additional mask layers in order to minimize the cost of fabrication.

It is within this context that embodiments of the present invention arise.

BRIEF DESCRIPTION OF THE DRAWINGS

FIG. 3A is a top plan view of a layout of a device die according to an embodiment of the present invention.

FIG. 3B is a top view of a portion of a single die near the border between the snubber region and the active device structure region.

FIG. 3C is a top view of a zoomed in portion of FIG. 3B.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention. In the following discussion, an N type device is described for purposes of illustration. P type devices may be fabricated using a similar process but with opposite conductivity types.

Figure 1A:
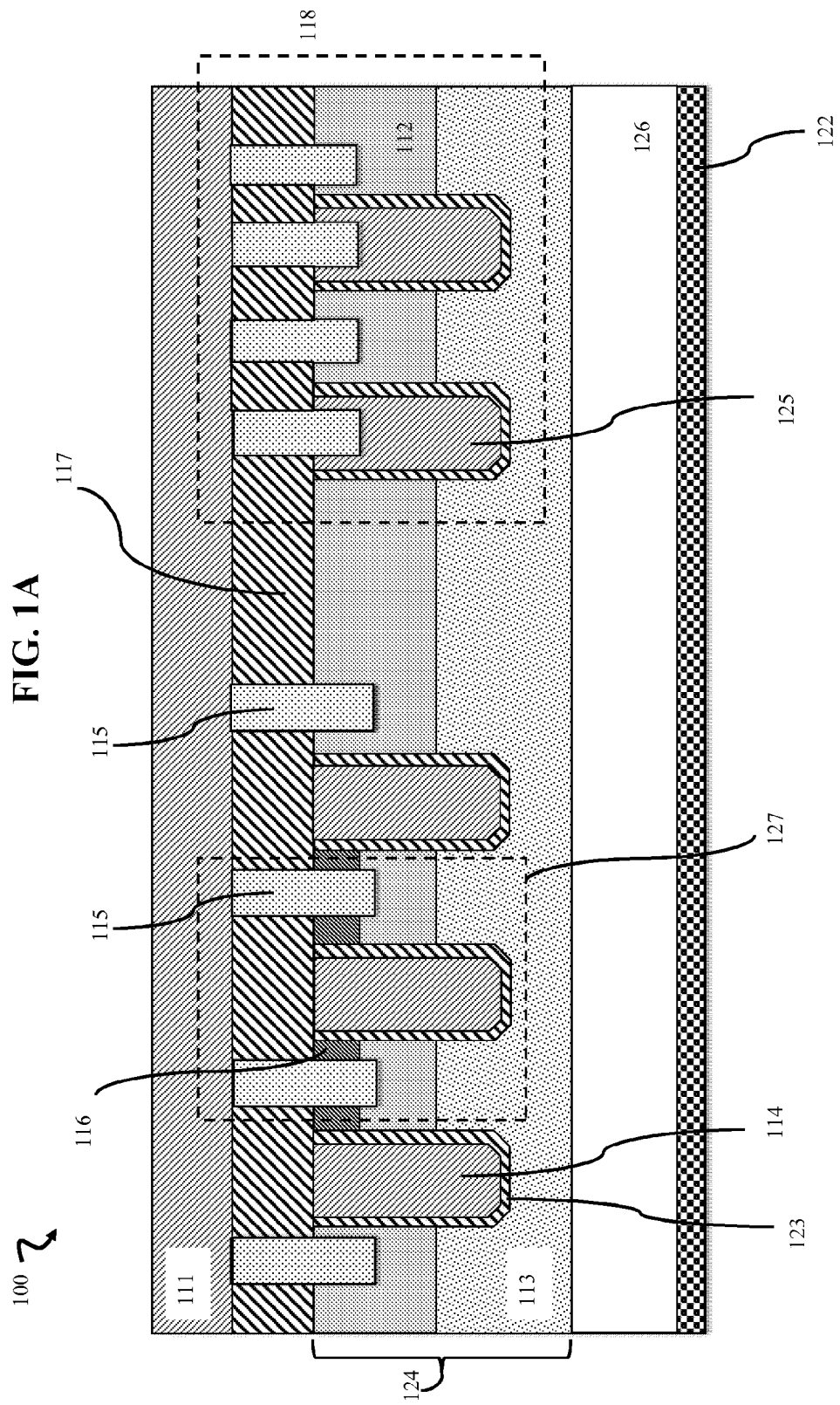
FIG. 1A is cross-sectional schematic diagram of an embodiment of the present invention in which dummy devices are integrated into a die containing trench MOSFET devices.

An embodiment of the present invention depicted in FIG. 1A allows for the incorporation of a snubber circuit and active MOSFETs device structures into the same device die. By way of example and not by way of limitation the device die is formed on an N⁺-doped semiconductor substrate 126 which serves as a drain region. The semiconductor substrate is electrically connected to the drain contact 122. An epitaxial N⁻ drift layer 113 is formed over the top surface of the substrate 126. The drift layer 113 is less heavily doped than the substrate 126. In the top portion of the drift layer, a P-body layer 112 is formed.

By way of example and not by way of limitation the active device structure 127 may be a single-gate trench MOSFET device. The active device structures 127 are formed by creating a trench that extends through the P-body layer 112 and into the drift layer 113. A dielectric material 123 is formed on the walls of the trench. The remainder of the trench is filled with a suitable material to form a gate electrode 114. By way of example and not by way of limitation the gate electrode may be formed with polysilicon. The gate electrode 114 is electrically isolated from the source material 111 by an insulation layer 117 which is deposited above the P-body layer 112. By way of example and not by way of limitation, the insulating layer 117 can be made from a low temperature oxide borophosphosilicate glass (LTO BPSG). Though not shown in FIG. 1, gate electrode 114 is connected to the gate pad and is maintained at a gate potential. $N^+$ source regions 116 are created within the P-body layer 112 and are electrically connected to the source material 111. By way of example and not by way of limitation, the connection may be made through the use of a vertical connection 115 which extend through the insulating layer 117. By way of example and not by way of limitation, the vertical connections 115 are made from a conductive material such as tungsten.

In order to create a snubber circuit within the same device die, the present invention uses dummy device structures 118. Dummy device structures 118 are configured to be in parallel with the active device structures (i.e., connected between the same source interconnect and drain interconnect to which the active devices are connected). The dummy device structures 118 are similar in structure to the active device structures 127. Each dummy device structure 118 includes a snubber electrode 125 substantially similar to the gate electrode 114 with the exception that the snubber electrode 125 is shorted to the source material 111 with a vertical connection 115. Additionally, there are no $N^+$ source regions formed in the body layer 112. Shorting the snubber electrode 125 to the source material 111 eliminates the presence of the gate potential which otherwise would be present. The $N^+$ source regions 116 are omitted in the dummy device structures 118 in order to prevent a channel from forming.

Figure 1B:
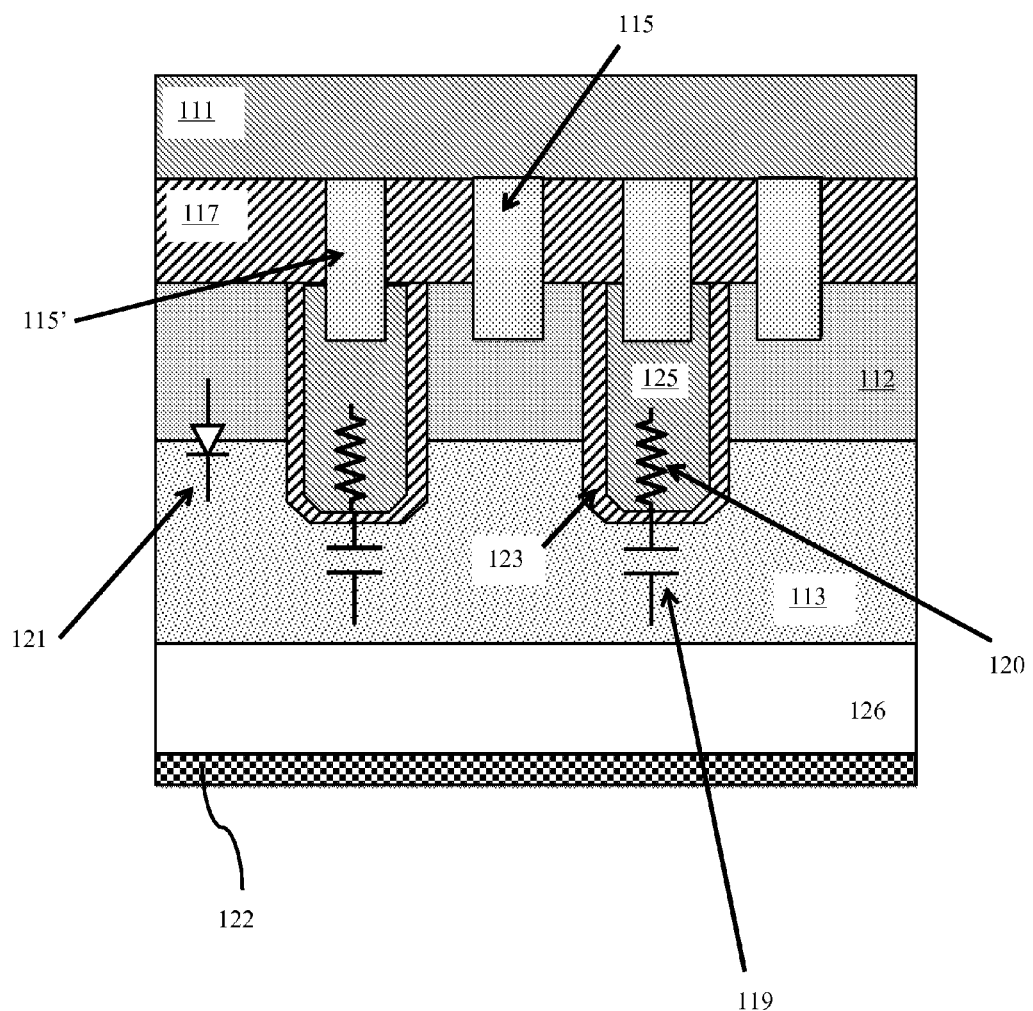
FIG. 1B is cross-sectional schematic diagram of an embodiment of the present invention showing the dummy devices and illustrating where physical features present in the device correspond to snubber circuitry.

FIG. 1B provides a schematic overlay of where the snubber circuit's electrical components are derived from. The snubber capacitor 119 is formed between the snubber electrode 125 and the drain 122. Shorting the snubber electrode 125 to the source material 111 causes the snubber electrode to acquire the source potential. The voltage difference between the source material 111 and the drain 122 induces a snubber capacitance to form within the dielectric material 123 which surrounds the snubber electrode. Since there is no gate or other electrode at the gate potential in the dummy device structure, the capacitances $C_{GS}$ and $C_{GD}$ can be ignored. The only significant capacitance that remains in the dummy device structure 118 is $C_{DS}$. $C_{DS}$ is a component of $C_{oss}$ and as such, the increase in $C_{DS}$ allows for an increase in $C_{oss}$. Furthermore, since the active device structures 127 and the dummy device structures 118 are connected in parallel the increase seen in $C_{oss}$ by the MOSFET device is greater than if the device structures had be connected in series.

The snubber resistor 120 is the internal resistance across the dummy device structure 118. The parasitic snubber diode 121 arises where the body diode of a functioning MOSFET would be, and accordingly may be thought of as arising at the junction between the P-body region 112 and the $N^-$ epi-layer 113.

Figure 2:
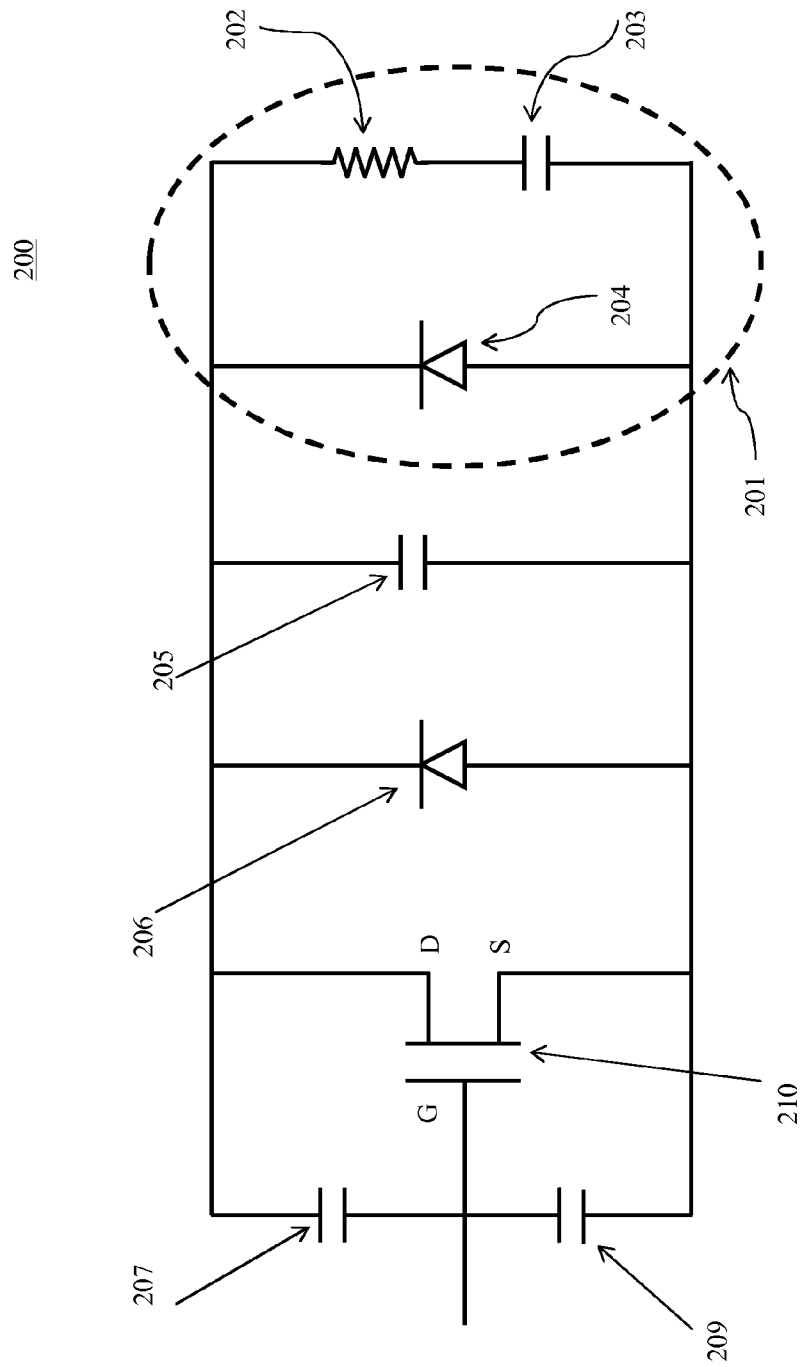
FIG. 2 is a circuit schematic diagram of a snubber incorporated into a MOSEFT device according to an embodiment of the present invention.

When a dummy device of the type shown in FIG. 1B is integrated in parallel with a MOSFET device according to an embodiment of the present invention is shown, the resulting device behaves as in an equivalent circuit 200 of the type shown in FIG. 2. As shown, the snubber circuit 201 consists of the snubber resistor 202, the snubber capacitor 203 and the parasitic snubber diode 204. It should also be noted that it is possible for the snubber resistor 202 and the snubber capacitor 203 to be reversed in the circuit. A MOSFET device 210 is also depicted with the parasitic capacitors $C_{GD}$ 207, $C_{GS}$ 209, $C_{DS}$ 205, and the parasitic body diode 206.

According to a first embodiment of the present invention, the dummy device structures 118 may be integrated into the same die as the active device structures 127, but the dummy device structures may be located in a separate geographic region of the die. By way of example and not by way of limitation, FIG. 3A provides a top view of one suitable layout for this embodiment. The single die 300 is divided into three distinct regions. Region 301 is where the dummy device structures 118 are fabricated. Region 302 is where the active device structures 127 are fabricated, and the gate pad is fabricated at region 303.

When the active device structures 127 and dummy device structures 118 are segregated as shown in FIG. 3A, the designer is free to adjust the density of the dummy devices and the active devices independently of each other. This flexibility allows for fine adjustments to the effect the snubber will have on the value of $C_{oss}$. Increasing density of the dummy device structures 118 relative to the active device structures 127 will increase the value of $C_{oss}$ and as a result decrease the voltage peak of the phase node. Therefore, the die can be modified to maximize the efficiency while still keeping the voltage peak of the phase node at turn-on below the MOSFET device's $V_{DS}$ rating.

Additionally, locating the dummy device structures 118 and active device structures 127 in distinct regions of the device die allows for independent adjustments in the structures themselves. By way of example and not by way of limitation parameters such as the thickness of the insulating dielectric layer 123 may be independently adjusted. Further, the pitch of the dummy device structures 118 can be designed independently of the active device structures 127 when this embodiment is employed. A number of unique adjustments may be made when the devices are located in different locations. First, the device is easy to layout. Second, the snubber trenches could be distributed among the active cells. Manufacturing process control can be much easier if the device has same pitch density for both active cells and snubber trenches. It is possible to have snubber trenches with a higher pitch density than the active cells though the process control is somewhat more complicated.

FIG. 3B shows a top view of a portion of the single die 300 near the border between the snubber region 301 and the active device structure region 302. The grey solid rectangles represent the polysilicon trenches which serve as the gate electrodes 314 and the snubber electrodes 325.

In the active device structure region 302 no connections 315 overlap with the gate electrodes 314. This prevents the source material 111 from being shorted to the gate electrodes 314. However, in the snubber region, the connections 315 do overlap with the snubber electrodes 325 and therefore, an electrical connection from the snubber electrodes 325 to the source material 111 is created. FIG. 3C provides a zoomed in view of the region surrounded by the dotted box 326 in order to provide further clarity in the depiction of the connections 315 which overlap the snubber electrodes.

The spacing of the connections in the snubber region 301 is shown as one of many possible options. The designer is free to adjust the spacing of the connections 315 that overlap with the snubber electrodes 325 in order to reduce the value of the snubber resistor in the circuit. If the design parameters dictate a higher resistance, the connections 315 that overlap with the snubber electrodes 325 may be spaced further apart and if a lower resistance is desired, the spacing of the connections 315 may be reduced.

The present embodiment also preserves the manufacturing efficiency, because no extra mask layers are needed to produce the finished device. The snubber devices can be made as part of the standard processing for a MOSFET device in the same sequence of operations used to form the active devices. The trenches for both the gate electrode 114 and the snubber electrode 125 may be formed in the same processing step. Additionally, the electrodes 114 and 125 may also be formed during the same processing step. Other structures which are similar between the MOSFET devices and the dummy devices such as, but not limited to, the body region 112, the source material layer 111, the electrical connections 115, and the insulating dielectric layers 123, may also be formed during the same processing step. Two examples, among others, of suitable manufacturing processes that may be used in conjunction with embodiments of the present invention are described in detail in U.S. Patent Application Publication Number 20110042727, which is incorporated herein by reference in its entirety. In particular FIGS. 3A-3N of U.S. Patent Application Publication Number 20110042727 and corresponding portions of the description at paragraphs 0021-0026 describe one process and FIGS. 4K-4N and paragraph 0034 describe another process. Even though the active device structures 127 and the dummy device structures 118 can be separated into distinct regions of the MOSFET device die, standard masks and processing steps are still employed in the overall fabrication. All of these structures can be fabricated using the same masks and at the same processing step. Aside from modifications to the masks, no further processing steps are needed to incorporate the dummy device structures 118 into the MOSFET device.

In a second embodiment of the present invention, the dummy device structures 118 can be intermixed with the active device structures 127 within the same region of the MOSFET device die. As with the previous embodiment, the density of the active device structures 127 and the dummy device structures 118 can be adjusted independently of each other. By way of example and not by way of limitation, a dummy device structure 118 can be fabricated in the die at every third active device structure 127. Alternatively, the duty cycle can be altered in order to make adjustments in the density of the dummy device structures 118. Integrating the dummy device structures 118 into the same region as the active device structures 127 can be done with little adjustment to the die layout because the dummy device structures 118 can be designed such that they have the same pitch as the active device structures 127.

Figure 4A:
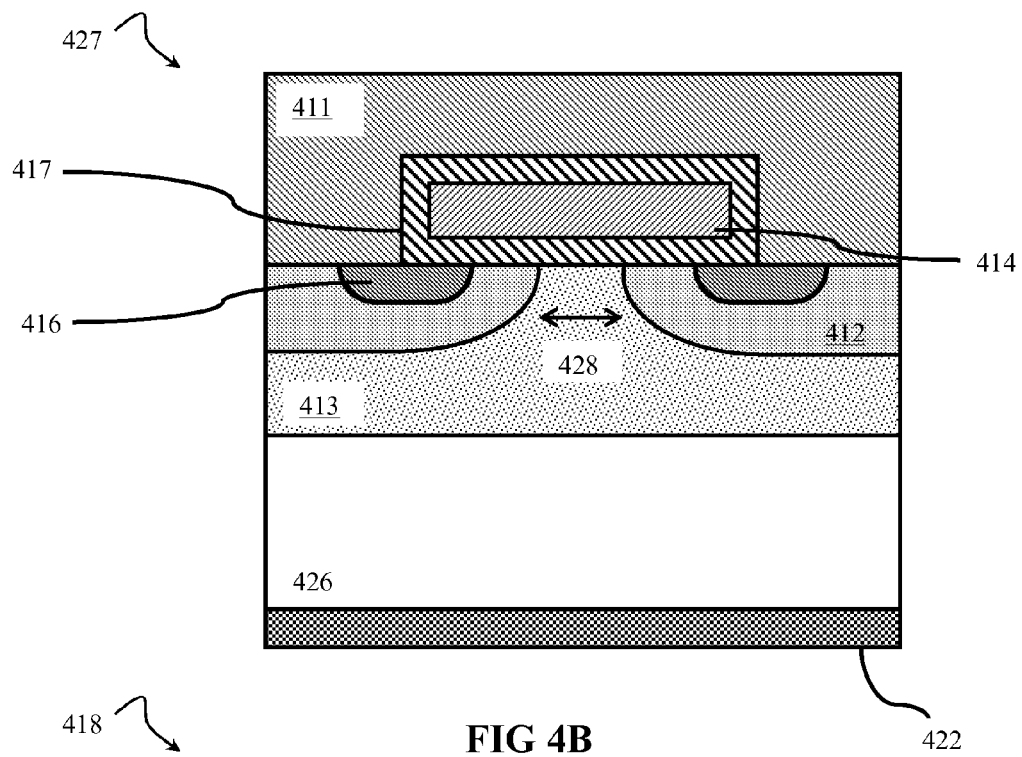
FIG. 4A is a cross-sectional schematic diagram depicting dummy devices being integrated into a die containing planar gate MOSFET devices according to another embodiment of the present invention.

FIG. 4A describes another embodiment of the present invention, in which the snubber circuit is integrated into a planar MOSFET device 427. By way of example and not by way of limitation the device die is formed on an N⁺-doped semiconductor substrate 426 which serves as a drain region. The semiconductor substrate 426 is electrically connected to the drain contact 422. An epitaxial N⁻ drift layer 413 is formed over the top surface of the substrate 426. In the top portion of the drift layer, P-body wells 412 are formed. The P-body wells are separated from each other by the channel width 428.

The active device structures 427 are formed by creating an N⁺ source region 416 within each P-body well. A gate electrode 414 is formed above the channel 428 in the drift region 413 and over a portion of the P-body well 412 and the source region 416 that are laterally adjacent the channel 428. An insulating layer 417 surrounds and electrically isolates the gate electrode 414. A source metal 411 may be deposited over the top surface of the device such that electrical contact is made with the source region 416 and the P-body well 412 while the gate electrode 414 is insulated from the source metal 411.

Figure 4B:
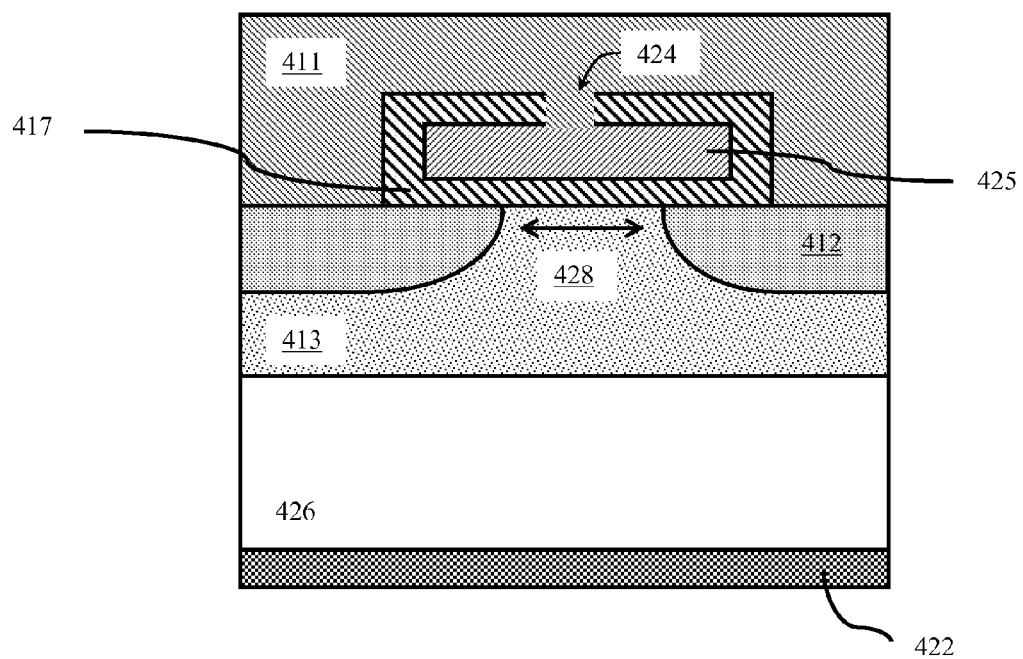
FIG. 4B is a cross-sectional schematic diagram depicting dummy devices being integrated into a die containing planar gate MOSFET devices according to yet another embodiment of the present invention.

The dummy device structure 418 which creates the snubber circuit is depicted in FIG. 4B. The structure is similar to that of the active device structure 427, with the exception that the snubber electrode 425 of a planar snubber device structure has been shorted to the source material 411 through a contact opening 424 in the insulating layer 417. This configuration allows the dummy device structure 418 to be fabricated using the same mask and the same processing step as the active device 427. Additionally, the N⁺ source regions 416 are omitted in order to prevent the device from turning into a functioning device structure.

Similar to the trench MOSFET embodiments, this embodiment also can be arranged such that the active device structures 427 and the dummy device structures 418 are separated into their own geographic regions of the device die as depicted in FIG. 3. Alternatively, the dummy device structures 418 can be intermixed with the active devices 427. As such, the planar MOSFET embodiment allows for the density of the active devices to be changed independently of the density of the dummy devices. By way of example and not by way of limitation, a dummy device structure 418 can be fabricated into the die at every third active device structure 427. Alternatively, the duty cycle can be altered in order to make adjustments in the density of the dummy device structures 418. Integrating the dummy device structures 418 into the same region as the active device structures 427 can be done with little adjustment to the die layout because the dummy device structures 418 can be designed such that they have the same pitch as the active device structures 427.

Similar to the trench MOSFET embodiments, this embodiment also maintains the desired manufacturing efficiency since no additional mask layers are needed for the production of the MOSFET device. The snubber devices can be made as part of the standard processing for a MOSFET device in the same sequence of operations used to form the active devices. The gate electrode 414 and the snubber electrode 425 may be formed in the same processing step. Other structures which are similar between the MOSFET devices and the dummy devices such as, but not limited to, the body region 412, the source material layer 411, and the insulating dielectric layers 417, may also be formed during the same processing step.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:
1. A MOSFET device, comprising:
    a semiconductor substrate of a first conductivity type;

a semiconductor drift region of the first conductivity type formed above the semiconductor substrate, wherein the drift region is less heavily doped than the substrate;

a body region of a second conductivity type formed in a top portion of the drift region, wherein the second conductivity type is opposite the first conductivity type;

one or more active MOSFET device structures formed from the drift region and body region, wherein each active MOSFET device structure includes an electrically insulated gate electrode; one or more source regions of the first conductivity type formed in a top portion of the body region proximate the gate electrode; an insulator portion formed over the gate electrodes and over a top surface of the body region; a conductive source electrode layer formed over the insulator portion; one or more electrical connections that connect the source electrode layer with the one or more source regions; and one or more dummy device structures formed from the drift region and body region electrically connected in parallel to the active MOSFET device structures, wherein each of the one or more dummy device structures includes an electrically insulated snubber electrode formed proximate the body region and the drift region; an insulator portion formed over the snubber electrode and over a top surface of the body region, and one or more electrical connections that connect the snubber electrode and nearby portions of the body region with the source electrode layer, wherein the electrical connections that connect the snubber electrode and nearby portions of the body region to the source electrode layer are connections that extend from the source electrode layer through the insulator portion.

2. The device of claim 1, wherein the one or more dummy device structures are located in different regions of a MOSFET device layout than the one or more active MOSFET device structures.

3. The device of claim 1, wherein the one or more dummy device structures are located in the same region of the MOSFET device layout and intermixed with the one or more active MOSFET device structures.

4. The device of claim 1, wherein each dummy device structure lacks a source region.

5. The device of claim 1, wherein each gate electrode is formed in a gate trench that extends through the body region into the drift region, wherein the gate electrode is electrically insulated from sidewalls and a bottom of the gate trench, wherein no additional electrode is located in the gate trench between the gate electrode and the bottom of the gate trench.

6. The device of claim 1, wherein each snubber electrode is formed in a trench that extends through the body region into the drift region, wherein the snubber electrode is electrically insulated from sidewalls and a bottom of the trench.

7. The device of claim 1, wherein each gate electrode is formed in a gate trench that extends through the body region into the drift region, wherein the gate electrode is electrically insulated from sidewalls and a bottom of the gate trench, wherein no additional electrode is located in the gate trench between the gate electrode and the bottom of the gate trench; and wherein each snubber electrode is formed in a trench that extends through the body region into the drift region, wherein the snubber electrode is electrically insulated from sidewalls and a bottom of the trench.

8. The device of claim 1, wherein the MOSFET device structures are planar device structures wherein the gate electrode is formed overlying a portion of a body well of the body region, the source region, and a channel portion of the drift region laterally adjacent the body well region.

9. The device of claim 1, wherein the dummy device structures are planar device structures wherein the snubber electrode is formed overlying a portion of a body well of the body region and a portions of the drift region laterally adjacent the body well region.

10. The device of claim 1, wherein the MOSFET device structures are planar device structures wherein the gate electrode is formed overlying a portion of a body well of the body region, the source region, and a channel portion of the drift region laterally adjacent the body well region; and wherein the dummy device structures are planar device structures wherein the snubber electrode is formed overlying a portion of a body well of the body region and a portions of the drift region laterally adjacent the body well region.

11. A method for forming a MOSFET device consisting of one or more active MOSFET device structures and one or more snubber circuits, comprising:

forming a semiconductor drift region of the first conductivity type formed above a semiconductor substrate of the first conductivity type, wherein the drift region is less heavily doped than the substrate;

forming a body region of a second conductivity type in a top portion of the drift region, wherein the second conductivity type is opposite the first conductivity type;

forming one or more active MOSFET device structures from the drift region and body region, wherein each active MOSFET device structure includes an electrically insulated gate electrode; one or more source regions of the first conductivity type formed in a top portion of the body region proximate the gate trench; an insulator portion formed over the gate electrodes and over a top surface of the body region; a conductive source electrode layer formed over the insulator portion; one or more electrical connections that connect the source electrode layer with the one or more source regions; and forming one or more dummy device structures from the drift region and body region, wherein the one or more dummy device structures are electrically connected in parallel to the active MOSFET device structures, wherein each of the one or more dummy device structures includes an electrically insulated snubber electrode formed proximate the body region and the drift region; an insulator portion formed over the snubber electrode and over a top surface of the body region, and one or more electrical connections that connect the snubber electrode and nearby portions of the body region with the source electrode layer, wherein the electrical connections that connect the snubber electrode and nearby portions of the body region to the source electrode layer are connections that extend from the source layer through the insulator portion.

12. The method of claim 11, wherein forming the one or more dummy device structures further includes forming the dummy device structures in a different region of a MOSFET device layout than where the one or more active MOSFET device structures are formed.

13. The method of claim 11, wherein forming the one or more dummy device structures further includes forming the one or more dummy device structures within the same region of the MOSFET device layout where the one or more active MOSFET device structures are formed.

14. The method of claim 11, wherein forming the one or more MOSFET device structures includes forming each gate electrode in a gate trench that extends through the body region into the drift region, wherein the gate electrode is electrically insulated from sidewalls and a bottom of the gate trench, wherein no additional electrode is located in the gate trench between the gate electrode and the bottom of the gate trench.

15. The method of claim 11, wherein forming the one or more dummy device structures includes forming each snubber electrode in a trench that extends through the body region into the drift region, wherein the snubber electrode is electrically insulated from sidewalls and a bottom of the trench.

16. The method of claim 11, wherein forming the one or more MOSFET device structures includes forming each gate electrode in a gate trench that extends through the body region into the drift region, wherein the gate electrode is electrically insulated from sidewalls and a bottom of the gate trench, wherein no additional electrode is located in the gate trench between the gate electrode and the bottom of the gate trench; and wherein forming the one or more dummy device structures includes forming each snubber electrode in a trench that extends through the body region into the drift region, wherein the snubber electrode is electrically insulated from sidewalls and a bottom of the trench.

17. The method of claim 16, wherein the gate trenches and the trenches for the snubber electrodes are formed in the same process step.

18. The method of claim 11, wherein the gate electrodes and the snubber electrodes are formed in the same process step.

19. The method of claim 11, wherein the one or more MOSFET device structures are planar device structures wherein the gate electrode is formed overlying a portion of a body well of the body region, the source region, and a channel portion of the drift region laterally adjacent the body well region.

20. The method of claim 11, wherein the dummy device structures are planar device structures wherein the snubber electrode is formed overlying a portion of a body well of the body region and a portion of the drift region laterally adjacent the body well region.

21. The method of claim 11, wherein the one or more MOSFET device structures are planar device structures wherein the gate electrode is formed overlying a portion of a body well of the body region, the source region, and a channel portion of the drift region laterally adjacent the body well region; and wherein the dummy device structures are planar device structures wherein the snubber electrode is formed overlying a portion of a body well of the body region and a portion of the drift region laterally adjacent the body well region.

* * * * *